United States Patent
Madiwal et al.

(10) Patent No.: US 9,435,025 B2
(45) Date of Patent: Sep. 6, 2016

(54) GAS APPARATUS, SYSTEMS, AND METHODS FOR CHAMBER PORTS

(71) Applicant: Applied Materials, Inc., Santa Clara, CA (US)

(72) Inventors: Nagendra V. Madiwal, Bangalore (IN); Robert Irwin Decottignies, Redwood City, CA (US); Andrew Nguyen, San Jose, CA (US); Paul B. Reuter, Austin, TX (US); Angela R. Sico, Round Rock, TX (US); Michael Kuchar, Georgetown, TX (US); Travis Morey, Austin, TX (US); Mitchell Disanto, Georgetown, TX (US)

(73) Assignee: Applied Materials, Inc., Santa Clara, CA (US)

( * ) Notice: Subject to any disclaimer, the term of this patent is extended or adjusted under 35 U.S.C. 154(b) by 426 days.

(21) Appl. No.: 14/036,754

(22) Filed: Sep. 25, 2013

(65) Prior Publication Data

US 2015/0083330 A1     Mar. 26, 2015

(51) Int. Cl.
*H01L 21/677*     (2006.01)
*C23C 14/56*     (2006.01)
*H01L 21/67*     (2006.01)
*C23C 16/44*     (2006.01)

(52) U.S. Cl.
CPC ........... *C23C 14/566* (2013.01); *C23C 14/564* (2013.01); *C23C 16/4401* (2013.01); *H01L 21/6719* (2013.01); *H01L 21/67126* (2013.01); *Y10T 29/49432* (2015.01)

(58) Field of Classification Search
CPC ................... H01L 21/67126; H01L 21/6719; C23C 14/564; C23C 16/4401; C23C 14/566; Y10T 29/49432

See application file for complete search history.

(56) References Cited

U.S. PATENT DOCUMENTS

| | | | |
|---|---|---|---|
| 5,951,770 A | 9/1999 | Perlov et al. |
| 6,287,386 B1 | 9/2001 | Perlov et al. |
| 6,468,353 B1 | 10/2002 | Perlov et al. |
| 6,575,737 B1 | 6/2003 | Perlov et al. |

(Continued)

FOREIGN PATENT DOCUMENTS

JP     2009-038073     2/2009

OTHER PUBLICATIONS

International Search Report and Written Opinion of International Application No. PCT/US2014/057242 mailed Jan. 19, 2015.

(Continued)

*Primary Examiner* — Gordon R Baldwin
*Assistant Examiner* — Yuechuan Yu
(74) *Attorney, Agent, or Firm* — Dugan & Dugan, PC

(57) ABSTRACT

An electronic device manufacturing system may include a chamber port assembly that provides an interface between a transfer chamber and a process chamber. In some embodiments, the chamber port assembly may be configured to direct a flow of purge gas into a substrate transfer area of the chamber port assembly. In other embodiments, a process chamber and/or the transfer chamber may be configured to direct a flow of purge gas into the substrate transfer area. The flow of purge gas into a substrate transfer area may prevent and/or reduce migration of particulate matter from chamber hardware onto a substrate being transferred between the transfer chamber and a process chamber. Methods of assembling a chamber port assembly are also provided, as are other aspects.

7 Claims, 12 Drawing Sheets

(56) References Cited

U.S. PATENT DOCUMENTS

| | | |
|---|---|---|
| 6,916,397 B2 | 7/2005 | Pfeiffer et al. |
| 6,955,197 B2 | 10/2005 | Elliott et al. |
| 7,147,424 B2 | 12/2006 | Weaver |
| 7,299,831 B2 | 11/2007 | Elliott et al. |
| 7,720,655 B2 | 5/2010 | Rice |
| 7,857,570 B2 | 12/2010 | Elliott et al. |
| 2004/0081546 A1 | 4/2004 | Elliott et al. |
| 2005/0072716 A1 | 4/2005 | Quiles et al. |
| 2006/0011140 A1 | 1/2006 | Blahnik et al. |
| 2006/0028596 A1 | 2/2006 | Leung et al. |
| 2007/0059127 A1 | 3/2007 | Guo et al. |
| 2009/0062960 A1 | 3/2009 | Krishnasamy et al. |
| 2009/0108544 A1 | 4/2009 | Sico et al. |
| 2012/0325140 A1 | 12/2012 | Schaller |

OTHER PUBLICATIONS

International Preliminary Report on Patentability of International Application No. PCT/US2014/057242 mailed Apr. 7, 2016.

Perlov et al., U.S. Appl. No. 10/193,605, titled: "Method and Apparatus for Improved Substrate Handling", filed Jul. 11, 2002.

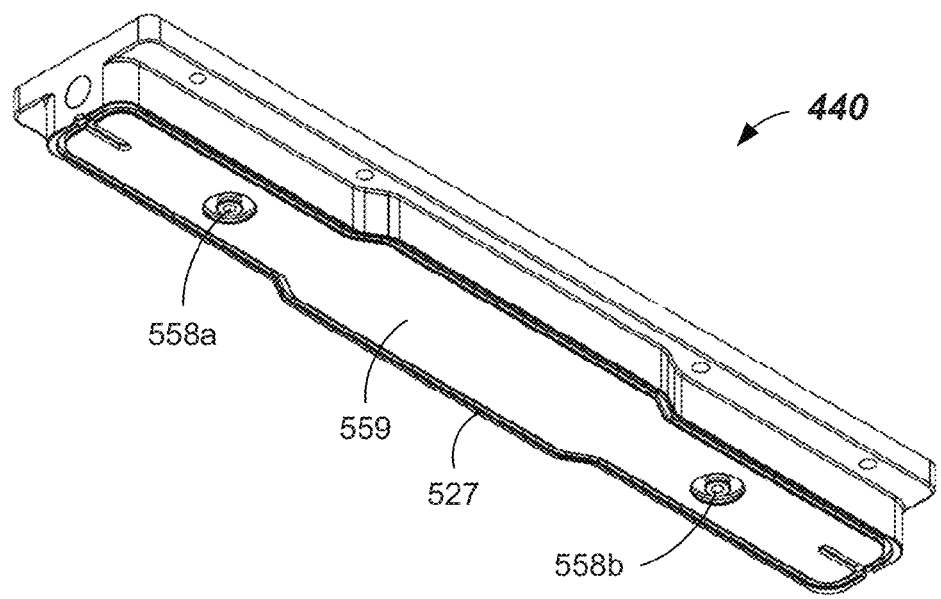
FIG. 5C
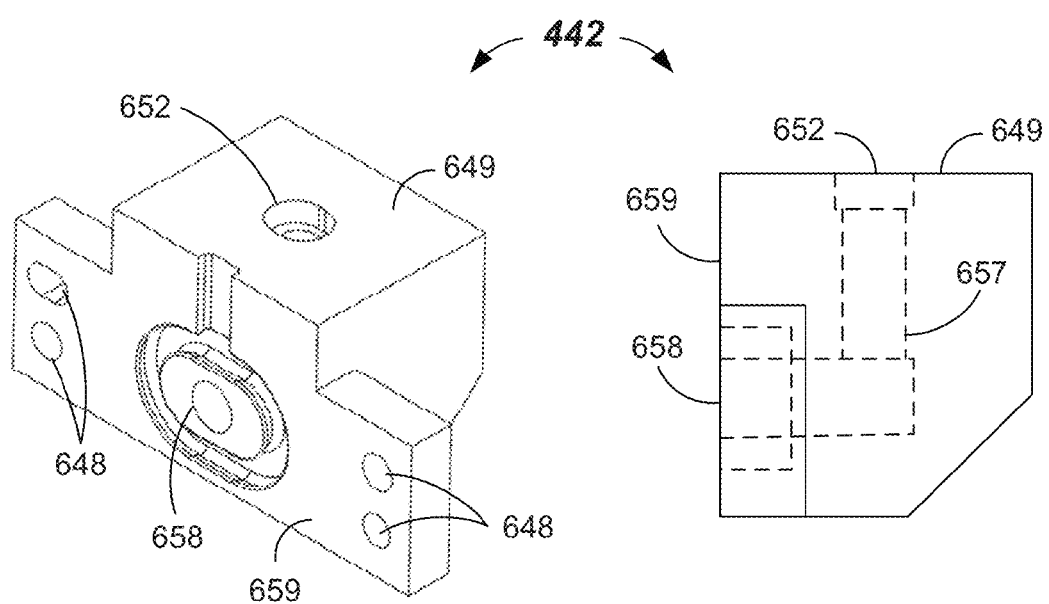
FIG. 6A
FIG. 6B

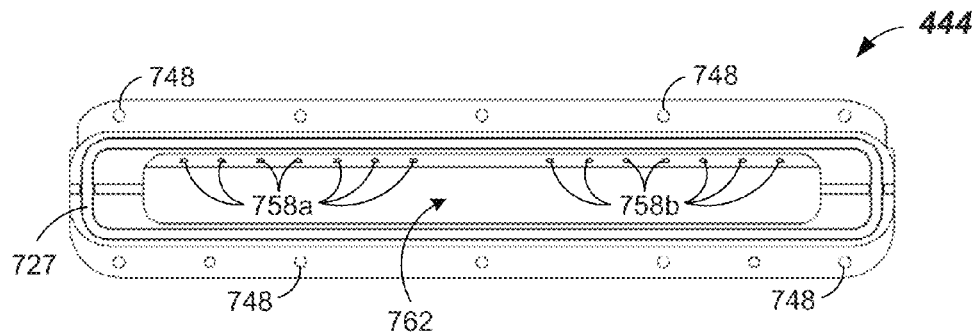
FIG. 7E
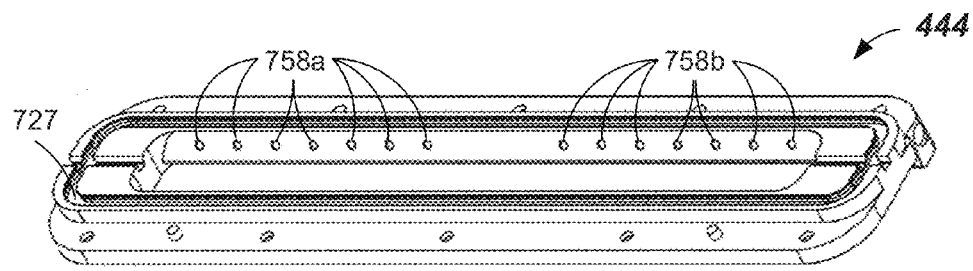
FIG. 7F
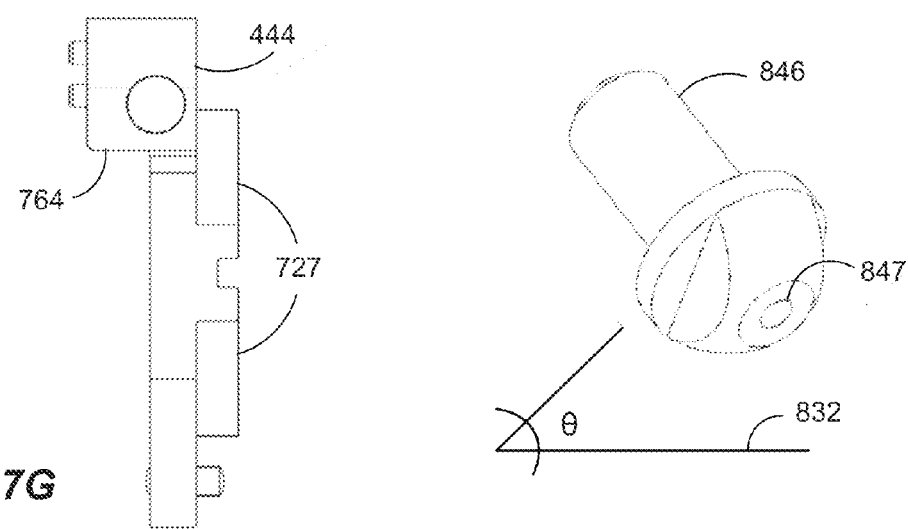
FIG. 7G
FIG. 8

GAS APPARATUS, SYSTEMS, AND METHODS FOR CHAMBER PORTS

FIELD

The invention relates generally to electronic device manufacturing, and more particularly to chamber ports through which substrates are transferred.

BACKGROUND

Conventional electronic device manufacturing systems may include one or more process chambers configured to perform any number of substrate processes including, e.g., degassing, pre-cleaning or cleaning, deposition (e.g., chemical vapor deposition (CVD), physical vapor deposition (PVD), and/or atomic layer deposition), coating, oxidation, nitration, etching (e.g., plasma etching), and the like. Substrates may be semiconductor wafers, glass plates or panels, and/or other workpieces used to make electronic devices or circuit components. Substrates may be transferred between a process chamber and a transfer chamber through a chamber port assembly that may include, e.g., a slit valve. A chamber port assembly provides an interface between chamber ports of a process chamber and a transfer chamber. Undesirable particulate matter from chamber hardware may migrate to a substrate during a transfer of the substrate through a chamber port assembly. The undesirable particulate matter may adversely affect the processing of the substrate, which may render any electronic device and/or circuit component(s) fabricated thereon unusable.

Accordingly, improved apparatus, systems, and methods for transferring a substrate through a chamber port assembly are desired.

SUMMARY

According to a first aspect, a chamber port assembly of an electronic device manufacturing system is provided. The chamber port assembly comprises a lid having a gas inlet formed therein and a first gas passageway extending there through, the first gas passageway in fluid communication with the gas inlet; a gas conduit member having a second gas passageway extending there through, the second gas passageway in fluid communication with the first gas passageway; a frame insert having a third gas passageway in fluid communication with the second gas passageway; and one or more gas nozzles coupled to the frame insert and in fluid communication with the third gas passageway, the one or more gas nozzles configured to direct a flow of gas received at the gas inlet into a substrate transfer area, the substrate transfer area configured to receive a substrate as the substrate is transferred through the chamber port assembly from a first chamber to a second chamber.

According to a second aspect, an electronic device manufacturing system is provided. The electronic device manufacturing system comprises a first chamber configured to receive a substrate therein, a second chamber configured to receive a substrate therein, a chamber port assembly interfacing the first chamber with the second chamber, the chamber port assembly having a substrate transfer area between the first chamber and the second chamber, the substrate transfer area configured to receive a substrate as the substrate is transferred through the chamber port assembly between the first chamber and the second chamber, a gas inlet, a gas conduit member having a gas passageway there through in fluid communication with the gas inlet, and one or more gas nozzles configured to direct a flow of gas received at the gas inlet into the substrate transfer area.

According to a third aspect, a method of assembling a chamber port assembly for an electronic device manufacturing system is provided. The method comprises providing a lid having a gas inlet formed therein and a first gas passageway extending there through, the first gas passageway in fluid communication with the gas inlet; providing a gas conduit member having a second gas passageway extending there through; providing a frame insert having a third gas passageway extending there through, the frame insert configured to receive one or more gas nozzles such that the third gas passageway is in fluid communication with the one or more gas nozzles; coupling the lid, gas conduit member, and frame insert such that the first, second, and third gas passageways are in fluid communication with each other; and attaching the one or more gas nozzles to the frame insert such that the one or more gas nozzles are configured to direct a flow of gas received at the gas inlet into a substrate transfer area of the chamber port assembly.

Still other aspects, features, and advantages of embodiments of the invention may be readily apparent from the following detailed description wherein a number of example embodiments and implementations are described and illustrated, including the best mode contemplated for carrying out the invention. The invention may also include other and different embodiments, and its several details may be modified in various respects, all without departing from the scope of the invention. Accordingly, the drawings and descriptions are to be regarded as illustrative in nature, and not as restrictive. The invention covers all modifications, equivalents, and alternatives falling within the scope of the invention.

BRIEF DESCRIPTION OF DRAWINGS

The drawings, described below, are for illustrative purposes only and are not necessarily drawn to scale. The drawings are not intended to limit the scope of this disclosure in any way.

FIG. 5C illustrates a bottom perspective view of the lid of FIG. 5A according to embodiments.

FIGS. 6A and 6B illustrate perspective and side orthographic views, respectively, of a gas conduit member of the chamber port assembly of FIG. 2 according to embodiments.

FIGS. 7E and 7F illustrate orthographic and perspective views, respectively, of a second chamber side of the frame insert of FIGS. 7A and 7B according to embodiments.

FIG. 7G illustrates a side orthographic view of the frame insert of FIGS. 7A-F according to embodiments.

FIG. 8 illustrates a perspective view of a gas nozzle of the chamber port assembly of FIG. 2 according to embodiments.

DETAILED DESCRIPTION

Reference will now be made in detail to the example embodiments of this disclosure, which are illustrated in the accompanying drawings. Wherever possible, the same reference numbers will be used throughout the drawings to refer to the same or like parts.

In one aspect, a chamber port assembly that provides an interface between two chambers, such as, e.g., a process chamber and a transfer chamber of an electronic device manufacturing system, may include gas apparatus configured to direct a flow of gas into a substrate transfer area of the chamber port assembly. Such a flow of gas, which may be a purge gas, such as, e.g., nitrogen, may reduce oxidation and/or corrosion of chamber port assembly parts and sealing interfaces, and/or may reduce particulate matter build-up in the substrate transfer area, and/or may purge the substrate transfer area to reduce and/or prevent migration of particulate matter from the chamber hardware onto a substrate being transferred through the chamber port assembly. In some embodiments, one or more parts of a conventional chamber port assembly may be modified to include, e.g., a gas inlet, one or more gas passageways, and one or more gas nozzles positioned proximate a substrate transfer area. In some embodiments, one or more additional part may be added to a conventional chamber port assembly to provide, e.g., one or more gas passageways in fluid communication with a gas inlet and/or one or more gas nozzles.

In another aspect, either or both chambers coupled to opposite sides of a chamber port assembly may include gas apparatus configured to direct a flow of gas into a substrate transfer area of the chamber port assembly. Either or both of the chambers may include a gas inlet and a gas conduit member coupled to the gas inlet. The gas conduit member may be configured to receive one or more gas nozzles positioned sufficiently proximate to the substrate transfer area to direct a flow of gas into the substrate transfer area. For example, in some embodiments, the gas inlet may be formed in a lid (i.e., top wall) or a side wall of the chamber, and/or the gas conduit member may be positioned and/or mounted on a lid or a side wall to which the chamber port assembly may be coupled.

In other aspects, methods of assembling a chamber port assembly for an electronic device manufacturing system are provided, as will be explained in greater detail below in connection with FIGS. 1-10.

Figure 1:
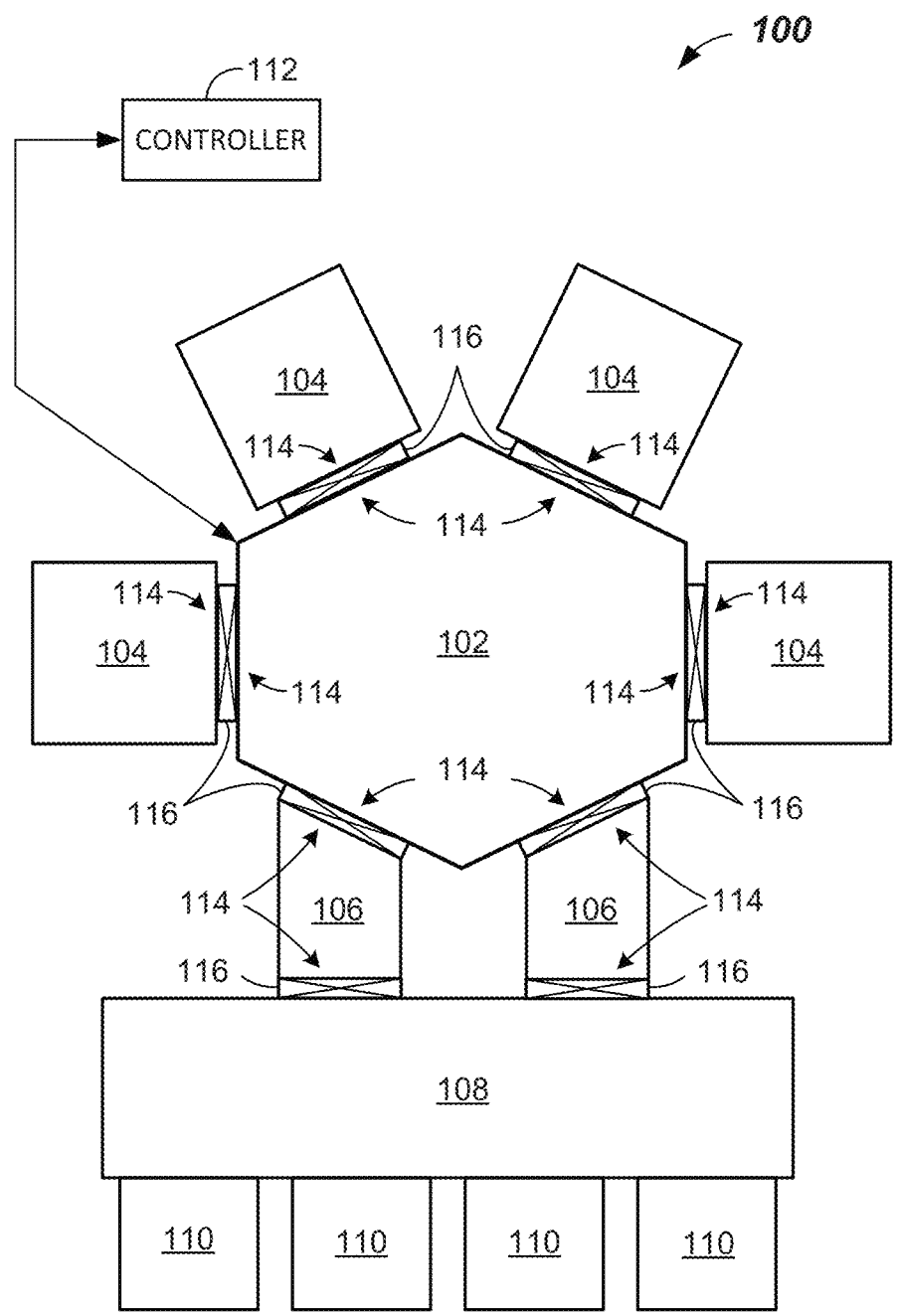
FIG. 1 illustrates a schematic top view of an electronic device manufacturing system according to embodiments.

FIG. 1 illustrates an electronic device manufacturing system 100 in accordance with one or more embodiments. Electronic device manufacturing system 100 may be configured to process multiple substrates concurrently. Substrates may be a semiconductor wafer, glass plate or panel, and/or other workpiece used to make electronic devices or circuit components. Electronic device manufacturing system 100 may include a transfer chamber 102, a plurality of process chambers 104, and one or more load lock chambers 106, each of which may operate at a vacuum pressure. Transfer chamber 102 may have a robot (not shown) configured to transfer substrates to and from each process chamber 104 and each load lock chamber 106.

Process chambers 104 may each perform a same or a different substrate process including, e.g., deposition (e.g., chemical vapor deposition (CVD), physical vapor deposition (PVD), and/or atomic layer deposition), oxidation, nitration, coating, etching (e.g., plasma etching), polishing, cleaning, lithography, degassing, or the like. Other substrate processes may additionally or alternatively be performed by process chambers 104. Within each process chamber 104, one or more substrates may be processed.

Load lock chambers 106 may each be a batch-type or single substrate-type load lock chamber. Load lock chambers 106 may be coupled to a factory interface 108 and may provide a first vacuum interface between factory interface 108 and transfer chamber 102.

Factory interface 108 may be coupled to one or more FOUPs (front opening unified pods) 110. Each FOUP 110 may be a container having a stationary cassette for holding multiple substrates. FOUPs 110 may each have a front opening interface configured to be used with factory interface 108. In other embodiments, any suitable type of pod and/or load port may be used instead of FOUPs 110. Factory interface 108 may have one or more robots (not shown) configured to transfer substrates in any sequence or direction via linear, rotational, and/or vertical movement between FOUPs 110 and load lock chambers 106. Electronic device manufacturing system 100 may have other suitable numbers of FOUPs 110.

A controller 112 may control some or all of the processing and transferring of substrates in and through electronic device manufacturing system 100. Controller 112 may be, e.g., a general purpose computer and/or may include a microprocessor or other suitable CPU (central processing unit), a memory for storing software routines that control electronic device manufacturing system 100, input/output peripherals, and support circuits (such as, e.g., power supplies, clock circuits, circuits for driving robots, a cache, and/or the like).

In other embodiments, electronic device manufacturing system 100 may have other suitable numbers and configurations of transfer chamber 102 (including other suitable shapes thereof), process chambers 104, and/or load lock chambers 106, each of which may be of conventional design and/or construction.

Transfer chamber 102 and each of process chambers 104 and load lock chambers 106 may have one or more chamber ports 114. A chamber port 114 may be an opening in a side wall of a chamber configured to allow a horizontally-oriented substrate to pass there through via a robot or other suitable mechanism. Each chamber port 114 may be, e.g., an elongated slot or slit. Chamber ports 114 may have other suitable configurations. Each chamber port 114 may be configured to be coupled to one side of a chamber port assembly 116.

A plurality of chamber port assemblies 116 may be included in electronic device manufacturing system 100. A chamber port assembly 116 may be configured to interface one chamber with another chamber at their corresponding chamber ports 114. For example, as shown in FIG. 1, a respective chamber port assembly 116 may interface transfer chamber 102 with process chambers 104 and/or load lock chambers 106. One chamber may be coupled to one side of a chamber port assembly 116, and the other chamber may be coupled to the opposite side of the chamber port assembly 116. Chamber port assembly 116 may have a substrate transfer area therein through which horizontally-oriented substrates may be transferred between adjoining chambers via robot or other suitable mechanism. A chamber port assembly 116 may include a slit valve mechanism or other suitable device for opening and closing an opening to the substrate transfer area.

Figure 2:
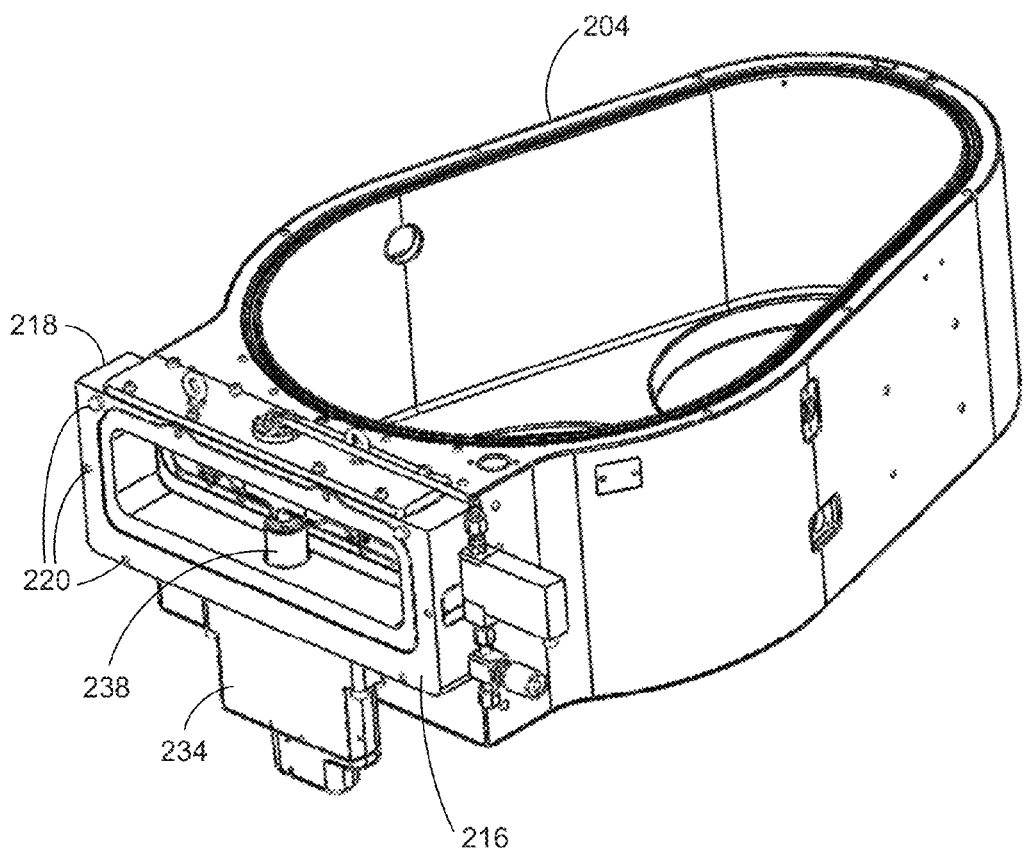
FIG. 2 illustrates a perspective view of a chamber port assembly coupled to a process chamber (with lid removed) according to embodiments.

FIG. 2 shows a chamber port assembly 216 coupled to a process chamber 204 (with lid removed) in accordance with one or more embodiments. Chamber port assembly 216 may include a frame 218 that has a plurality of coupling locations 220 (only three are labeled in FIG. 2) formed on each side of frame 218 that interfaces a chamber. Coupling locations 220 may be, e.g., threaded holes configured to receive a corresponding threaded fastener. For example, chamber port assembly 216 may be coupled to process chamber 204 with a plurality of fasteners, which may have a threaded portion, inserted through corresponding through-holes in a side wall of process chamber 204 and received in a respective plurality of coupling locations 220 formed on frame 218. One or more O-rings may be disposed between chamber port assembly 216 and process chamber 204 to provide an airtight seal there between. The airtight seal allows substrates to pass between chambers without either chamber losing a vacuum pressure therein. Chamber port assembly 216 may be coupled to process chamber 204 in any other suitable manner.

Figure 3A:
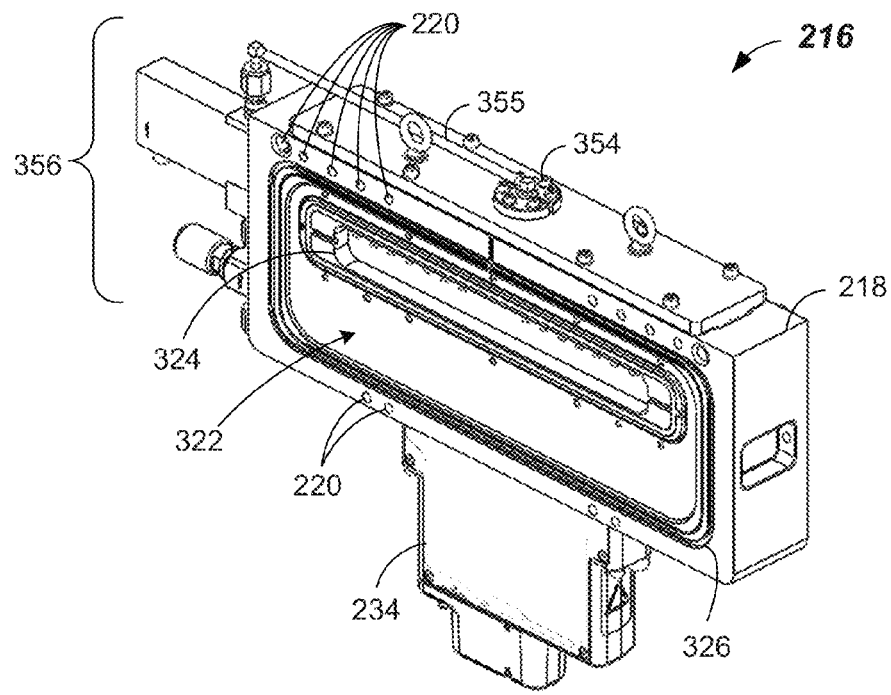
FIGS. 3A and 3B illustrate perspective and orthographic views, respectively, of a first chamber side of the chamber port assembly of FIG. 2 according to embodiments.
Figure 3B:
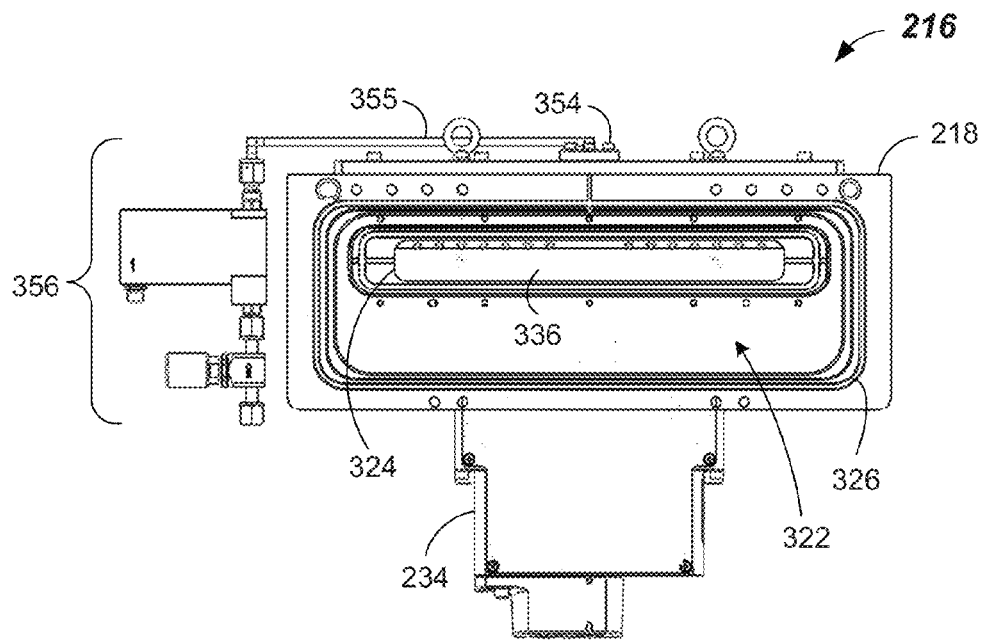

Chamber port assembly 216 may have a first chamber side 322, which may be a process chamber side, as shown in FIGS. 3A and 3B. First chamber side 322 may be configured to be coupled to, e.g., process chamber 204 as described above and/or to any one of process chambers 104. First chamber side 322 may have a first opening 324 sized to allow a horizontally-oriented substrate to pass there through via robot or other suitable mechanism. As described above, first chamber side 322 may have a plurality of coupling locations 220 (seven are labeled in FIG. 3A) formed on frame 218 for coupling to a process chamber. First chamber side 322 may also have one or more O-rings 326 disposed thereon to provide an airtight seal with a process chamber.

Figure 3C:
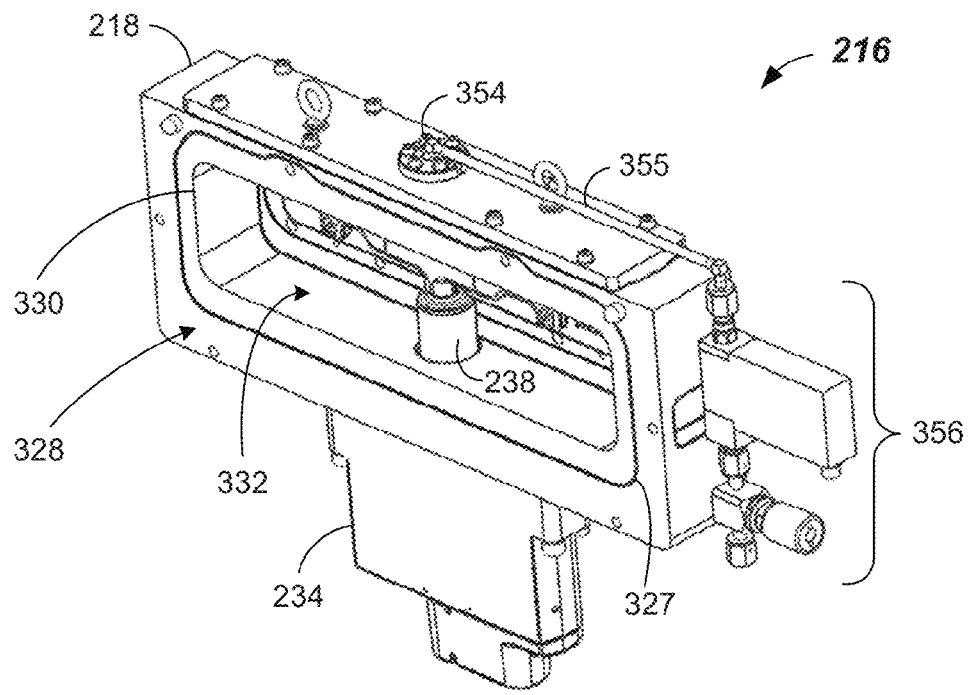
FIGS. 3C and 3D illustrate perspective and orthographic views, respectively, of a second chamber side of the chamber port assembly of FIG. 2 according to embodiments.
Figure 3D:
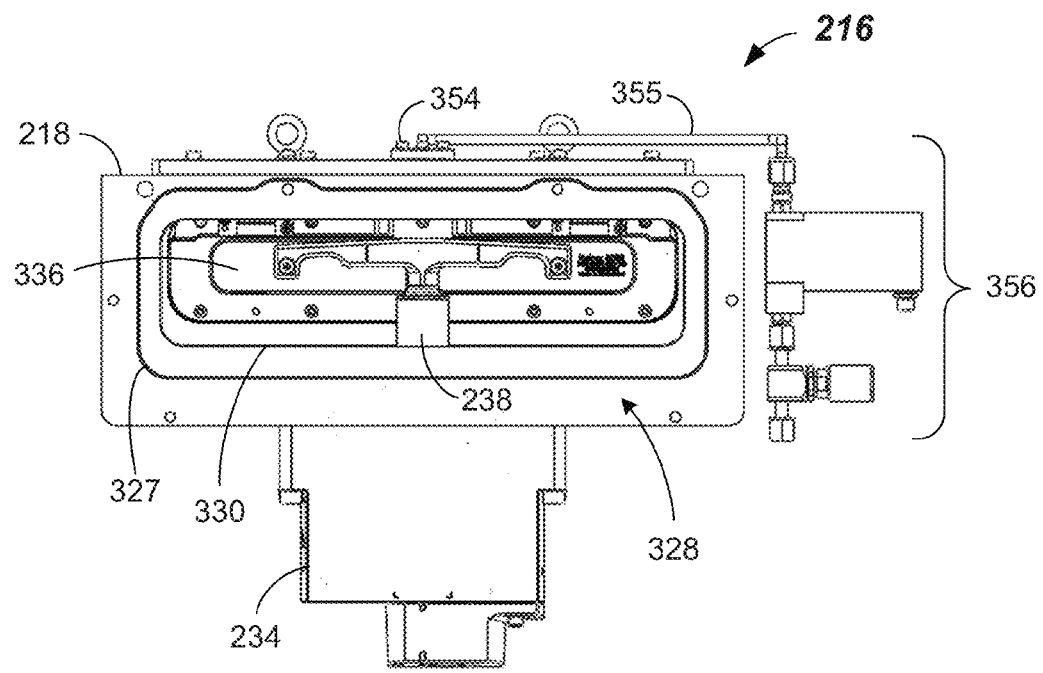

Chamber port assembly 216 may have a second chamber side 328, which may be a transfer chamber side, as shown in FIGS. 3C and 3D. Second chamber side 328 may be configured to be coupled to, e.g., transfer chamber 102. Second chamber side 328 may have one or more O-rings 327 (only one is shown) disposed thereon to provide an airtight seal between chamber port assembly 216 and a transfer chamber. Second chamber side 328 may have a second opening 330 sized to allow a horizontally-oriented substrate to pass there through via robot or other suitable mechanism. Second opening 330 may be larger than first opening 324. A substrate transfer area 332 may be located between first chamber side 322 and second chamber side 328, and more particularly, between first opening 324 and second opening 330. Substrate transfer area 332 may be configured to receive a substrate there through as the substrate is transferred via robot or other suitable mechanism through chamber port assembly 216 from a first chamber to a second chamber, which may be a process chamber and a transfer chamber or vice versa.

Chamber port assembly 216 may include a slit valve mechanism 234. Slit valve mechanism 234 may include a slit valve door 336 (see FIGS. 3B and 3D) and an actuating cylinder 238 for manipulating slit valve door 336. In some embodiments, slit valve door 336 and actuating cylinder 238 may be located in the substrate transfer area 332. Slit valve door 336 may be configured to have open and closed positions. In the open position, a substrate may be transferred via robot or other suitable mechanism through substrate transfer area 332 and first and second openings 324 and 330. In the closed position, slit valve door 336 may seal first opening 324 to provide an airtight boundary between the adjoining chambers coupled to chamber port assembly 216. In some embodiments, slit valve mechanism 234 may be an L-motion slit valve mechanism. Slit valve mechanism 234 may otherwise be of any suitable and/or conventional construction. Other suitable devices may alternatively be used for opening and closing chamber port assembly 216.

Figure 4A:
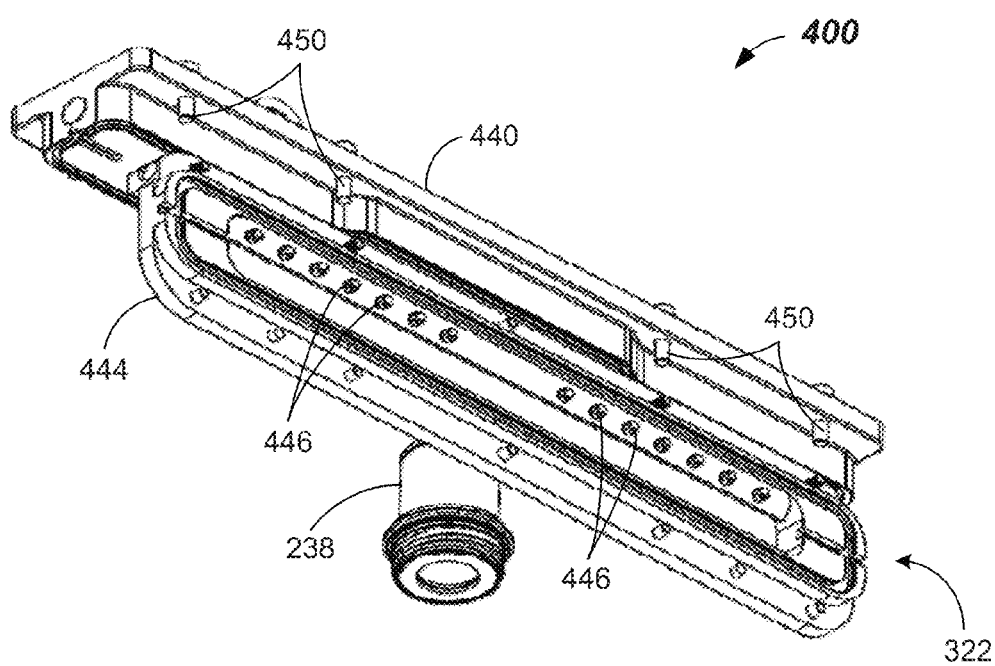
FIGS. 4A and 4B illustrate perspective and orthographic views, respectively, of a first chamber side of a subassembly of the chamber port assembly of FIG. 2 according to embodiments.
Figure 4B:
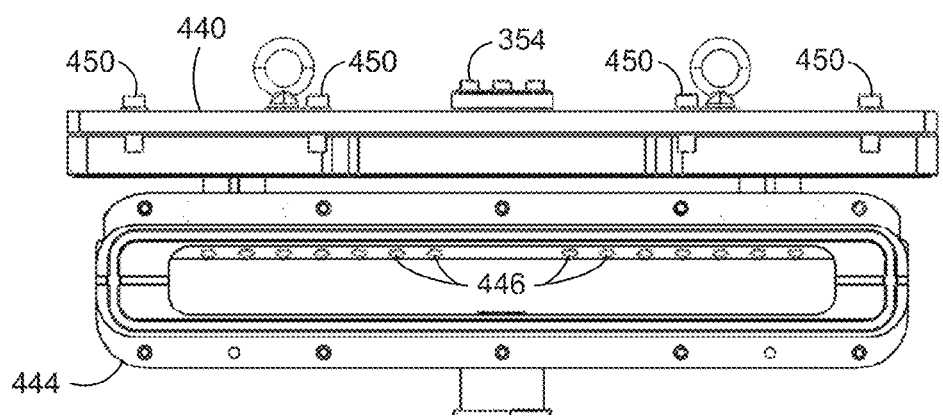
Figure 4C:
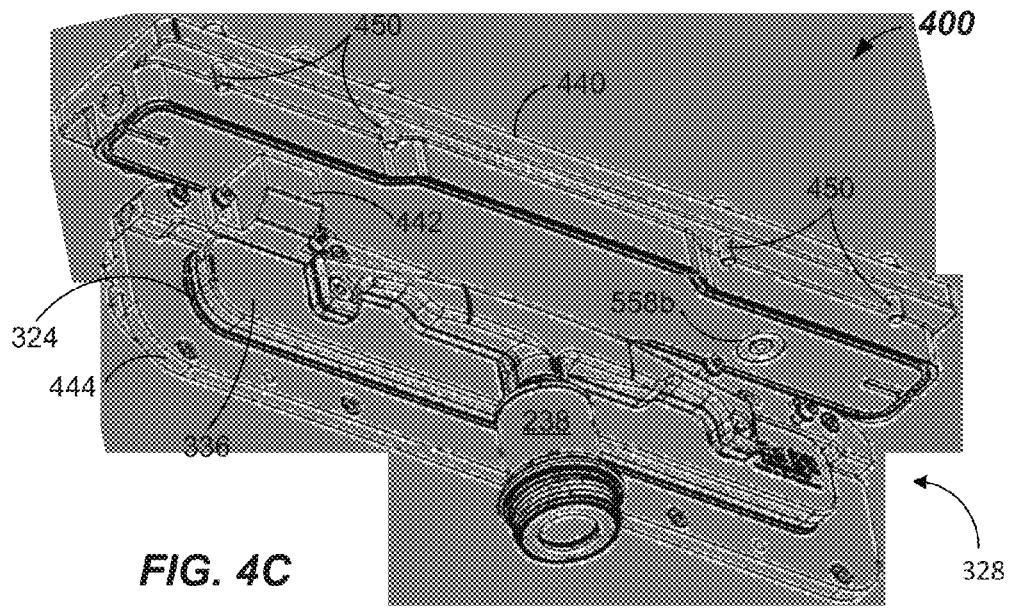
FIGS. 4C and 4D illustrate perspective and orthographic views, respectively, of a second chamber side of the subassembly of FIGS. 4A and 4B according to embodiments.
Figure 4D:
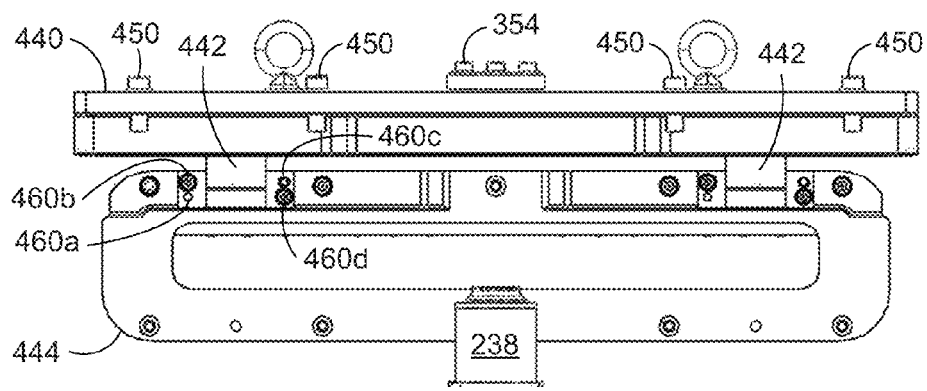
Figure 4E:
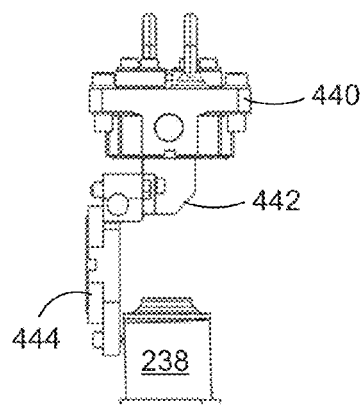
FIG. 4E illustrates a side orthographic view of the subassembly of FIGS. 4A-D according to embodiments.

FIGS. 4A-E show a sub-assembly 400 of chamber port assembly 216 that may be configured to provide purge gas capability to substrate transfer area 332 in accordance with one or more embodiments. Purge gas capability in and around substrate transfer area 332 may reduce oxidation and/or corrosion of chamber port assembly parts and sealing components, may reduce particulate matter build-up in substrate transfer area 332, and/or may purge substrate transfer area 332 of particulate matter from chamber hardware that may migrate onto a substrate being transferred through chamber port assembly 216. Sub-assembly 400 of chamber port assembly 216 may include a lid 440, one or more gas conduit members 442, a frame insert 444, and one or more gas nozzles 446 (only four of which are labeled in each of FIGS. 4A and 4B). FIGS. 4A and 4B show lid 440, frame insert 444, and gas nozzles 446 from first chamber side 322 of chamber port assembly 216, while FIGS. 4C, 4D, and 4E show lid 440, gas conduit members 442, and frame insert 444 from second chamber side 328 of chamber port assembly 216.

As best shown in FIG. 4C, slit valve door 336 may abut frame insert 444 and seal first opening 324 when slit valve door 336 is in the closed position. That is, slit valve door 336 may be seated in, and biased against, frame insert 444 by actuating cylinder 238 of slit valve mechanism 234 to create an airtight seal at first opening 324.

Figure 5A:
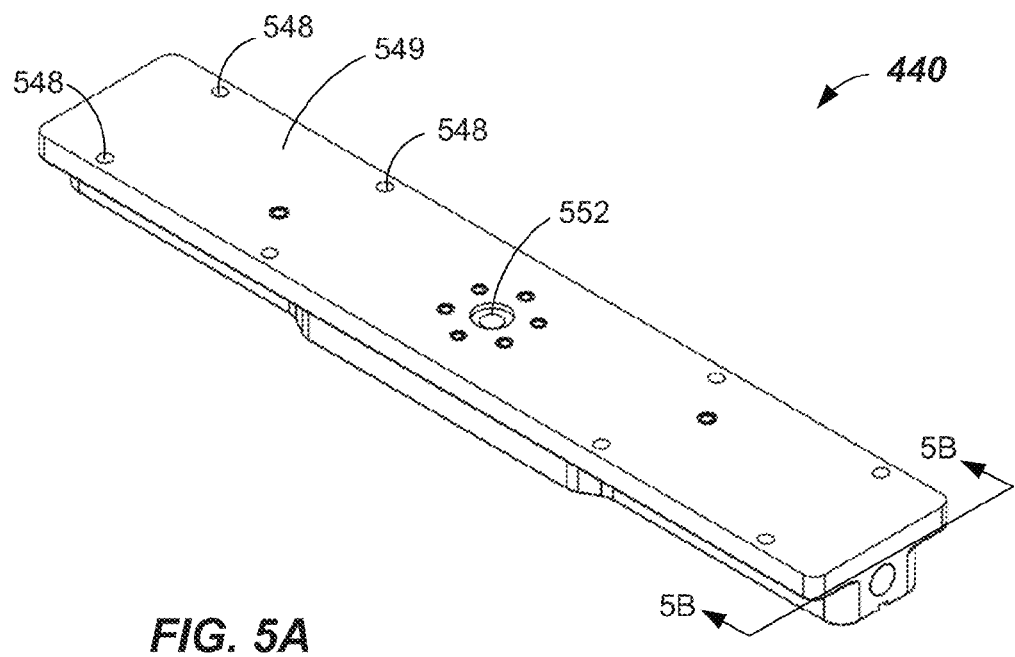
FIG. 5A illustrates a top perspective view of a lid of the chamber port assembly of FIG. 2 according to embodiments.
Figure 5B:
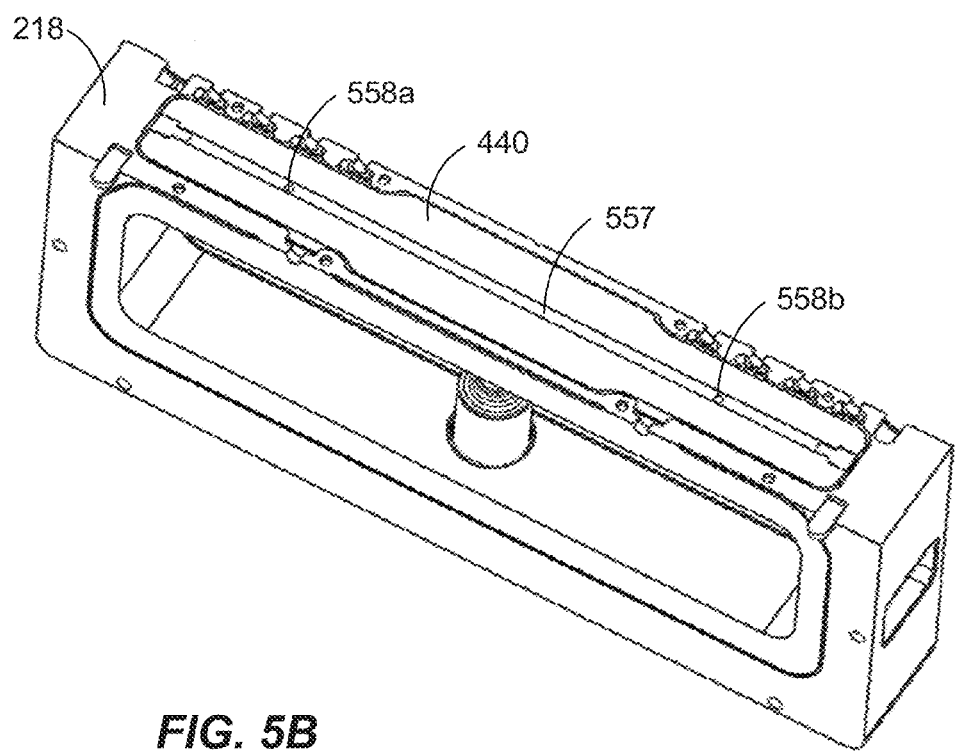
FIG. 5B illustrates a top perspective view of the lid (with top surface removed) of FIG. 5A attached to a frame of the chamber port assembly of FIG. 2 according to embodiments.

FIGS. 5A-C show lid 440, which in some embodiments, may be seated on or butted against each of gas conduit members 442 (note that in FIG. 4C only one gas conduit member 442 is shown). In other words, lid 440 may not be mechanically fastened or attached directly to gas conduit members 442. Instead, as shown in FIG. 5A, lid 440 may have a plurality of through-holes 548 (of which only three are labeled) formed in a top surface 549 of lid 440. Through-holes 548 may each be configured to receive a fastener 450 (see FIGS. 4A-E) for attaching lid 440 to frame 218 of chamber port assembly 216 (see FIG. 5B). Fasteners 450 may be, e.g., threaded screws or bolts. As shown in FIG. 5C, an O-ring 527 seated in a groove around the perimeter of a bottom surface 559 of lid 440 may be used to provide an airtight seal with frame 218. Lid 440 may be secured to frame 218 in any other suitable manner. In other embodiments, lid 440 may alternatively or additionally be mechanically fastened or attached directly to gas conduit members 442.

As also shown in FIG. 5A, lid 440 may have a gas inlet 552 formed in top surface 549. Gas inlet 552 may be configured to couple to, as shown in FIGS. 3A-D, a gas inlet connector 354, which in turn may be coupled to a gas line 355, which may be coupled to gas delivery apparatus 356. Some or all of gas inlet connector 354, gas line 355, and gas apparatus 356 may be of conventional design and/or construction. In some embodiments, gas delivery apparatus 356 may be configured to deliver a purge gas, such as, e.g., nitrogen, to chamber port assembly 216, as described further below.

FIG. 5B shows lid 440 (with top surface 549 removed along section line 5B-5B of FIG. 5A) attached to frame 218. Lid 440 may have a gas passageway 557 extending internally and longitudinally through lid 440. Gas passageway 558 may be in fluid communication with gas inlet 552 and gas outlets 558a and 558b. As shown in FIG. 5C, gas outlets 558a and 558b may extend through bottom surface 559 of lid 440. Lid 440 may be made of aluminum, stainless steel, one or more titanium-based materials, and/or any other suitable material.

FIGS. 6A and 6B show a gas conduit member 442 in accordance with one or more embodiments. In some embodiments, one or more gas conduit members 442 may be disposed between lid 440 and frame insert 444, as perhaps best shown in FIG. 4E. Gas conduit member 442 may be attached to frame insert 444 with bolts or screws. For example, gas conduit members 442 may have a plurality of through-holes 648 configured to align with coupling locations 460a-d formed on frame insert 444 (see, e.g., FIG. 4D). Coupling locations 460a-d may each be threaded holes configured to receive a threaded bolt or screw, which may be, e.g., a hex-headed bolt or screw that can be installed and removed with a stubbed hex-headed key tool for convenience. In some embodiments, e.g., two of four coupling locations 460a and 460c may be alignment dowels configured to be received in two of four aligned through-holes 648, wherein bolts or screws may be fastened through the other two through-holes 648 into aligned coupling locations 460b and 460d. Gas conduit member 442 may be attached to frame insert 444, or any other suitable part of chamber port assembly 216, in any other suitable manner. Gas conduit member 442 may be of other suitable shapes and/or configurations. Gas conduit member 442 may be made of aluminum, stainless steel, a polyimide-based plastic such as, e.g., Vespel® by DuPont™, and/or any other suitable material.

Gas conduit member 442 may have a gas inlet 652, a gas outlet 658, and a gas passageway 657 extending internally through gas conduit member 442. Gas passageway 657 may connect gas inlet 652 to gas outlet 658. Gas inlet 652 may be formed in a top surface 649 of gas conduit member 442, and gas outlet 658 may be formed in side surface 659 of gas conduit member 442. Gas passageway 657 may be in fluid communication with gas passageway 557 of lid 440 upon lid 440 being coupled to gas conduit member 442. That is, e.g., upon lid 440 being seated on or butted against gas conduit member 442, gas inlet 652 may be coupled to one of gas outlets 558a or 558b (using any suitable connectors, O-rings, etc.) such that a sealed gas connection is formed there between. In some embodiments, as shown in FIG. 4D, two gas conduit members 442 are included in sub-assembly 400. Other embodiments may have one gas conduit member 442 or more than two gas conduit members 442.

Figure 7A:
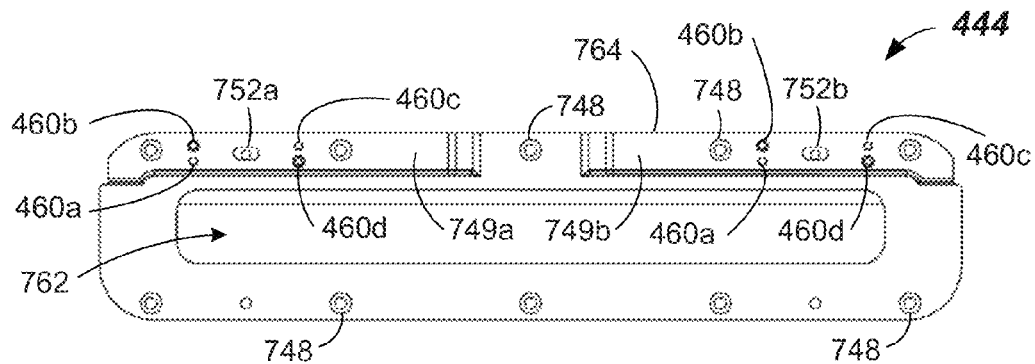
FIGS. 7A and 7B illustrate orthographic and perspective views, respectively, of a first chamber side of a frame insert of the chamber port assembly of FIG. 2 according to embodiments.
Figure 7B:
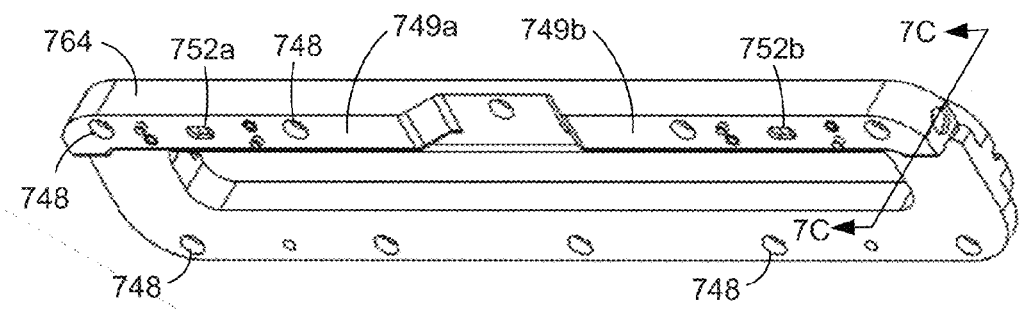

FIGS. 7A-F show frame insert 444 of chamber port assembly 216 in accordance with one or more embodiments. FIGS. 7A and 7B show frame insert 444 from second chamber side 328, and FIGS. 7E and 7F show frame insert 444 from first chamber side 322. FIG. 7G shows a side view of frame insert 444. Frame insert 444 may have an opening 762 sized substantially identically as first opening 324. Frame insert 444 may be coupled to frame 218 of chamber port assembly 216. Frame insert 444 may have a plurality of through-holes 748 (of which only four are labeled in each of FIGS. 7A, 7B, and 7E). Through-holes 748 may be configured to receive fasteners there through for fastening to corresponding aligned coupling locations (not shown) on frame 218. The fasteners may be, e.g., hex-headed bolts or screws that can be installed and removed with a stubbed hex-headed key tool for convenience. In some embodiments, frame insert 444 may be removable and replaceable without having to remove chamber port assembly 216 from any attached chambers. In some embodiments, frame insert 444 may be removed and/or replaced by first removing lid 440. Frame insert 444 may include a groove 727 (FIG. 7E) configured to receive an O-ring therein to provide an airtight seal with frame 218. Frame insert 444 may be attached to frame 218, and/or any other suitable part of chamber port assembly 216, in any other suitable manner. Frame insert 444 may be made of anodized aluminum or any other suitable material.

Frame insert 444 has a top portion 764 to which a pair of gas conduit members 442 may be attached at respective coupling locations 460a-d, as described above. Top portion 764 may have gas inlets 752a and 752b formed in respective side surfaces 749a and 749b of top portion 764. Gas inlets 752a and 752b, which may be identical to each other, may each be configured to couple with a gas outlet 658 of a respective gas conduit member 442. That is, upon attachment of a gas conduit member 442 to frame insert 444 at one of side surfaces 749a or 749b, gas inlet 752a or 752b may be coupled to gas outlet 658 (using any suitable connectors, O-rings, etc.) such that a sealed gas connection is formed there between.

Figure 7C:
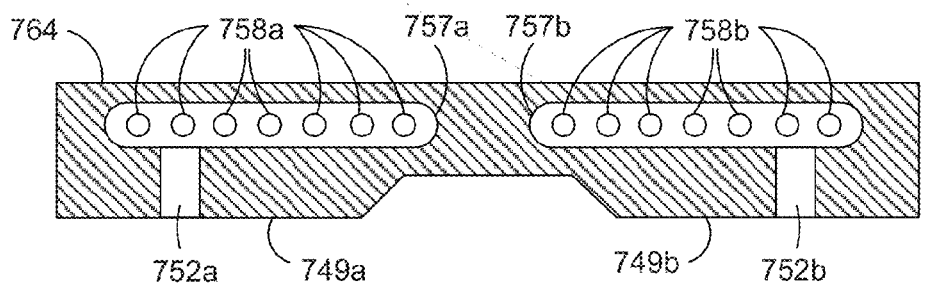
FIGS. 7C and 7D illustrate schematic cross-sectional views of alternative embodiments of a portion of the frame insert of FIGS. 7A and 7B taken along section line 7C-7C of FIG. 7B.

As shown in FIG. 7C, top portion 764 of frame insert 444 may include a first plurality of gas outlets 758a and a gas passageway 757a extending internally and longitudinally through a first section of frame insert 444. Gas passageway 757a may connect gas inlet 752a to each of gas outlets 758a. Top portion 764 of frame insert 444 may also include a second plurality of gas outlets 758b and a gas passageway 757b extending internally and longitudinally through a second section of frame insert 444. Gas passageway 757b may connect gas inlet 752b to each of gas outlets 758b. Each of gas outlets 758a and 758b may be identical to each other. Although seven gas outlets 758a/758b are shown in each section, other embodiments may have any suitable number of gas outlets 758a/758b in each section of frame insert 444.

Upon assembly of lid 440 and frame insert 444 with a first gas conduit member 442 (e.g., to gas inlet 752a), as described above, gas passageway 757a of frame insert 444 may be in fluid communication with gas passageway 657 of the first gas conduit member 442 and gas passageway 557 of lid 440. Similarly, upon assembly of lid 440 and frame insert 444 with a second gas conduit member 442 (e.g., to gas inlet 752b), as described above, gas passageway 757b may be in fluid communication with gas passageway 657 of the second gas conduit member 442 and gas passageway 557 of lid 440. The assembly of lid 440 and frame insert 444 with first and second gas conduit members 442 may occur concurrently.

Figure 7D:
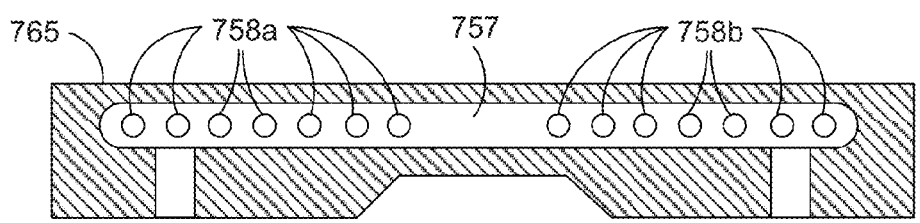

In alternative embodiments, as shown in FIG. 7D, frame insert 444 may have a top portion 765 that includes gas outlets 758a and 758b and a single gas passageway 757 extending internally and longitudinally through frame insert 444. Gas passageway 757 may connect gas inlets 752a and 752b to each of gas outlets 758a and 758b such that all are in fluid communication with each other. Although 14 total gas outlets 758a and 758b are shown in top portion 765, other embodiments may have any suitable number of gas outlets 758a or 758b in top section 765 of frame insert 444. Top portion 765 may otherwise be similar or identical to top portion 764. Upon assembly of frame insert 444 with one or two gas conduit members 442 and lid 440 as described above, gas passageway 757 may be in fluid communication with gas passageway 657 of one or both of gas conduit members 442 and gas passageway 557 of lid 440.

Each of gas outlets 758a and 758b of frame insert 444 may be configured to receive a gas nozzle 446. An embodiment of gas nozzle 446 may be, e.g., gas nozzle 846 of FIG. 8. Gas nozzle 846 may be made of, e.g., a polyimide-based plastic such as, e.g., Vespel® by DuPont™. Gas nozzle 846 may alternatively be made of any other suitable material(s). Gas nozzle 846 may be inserted into a gas outlet 758a or 758b and held in place by an adhesive or by friction. Gas nozzle 846 may otherwise be coupled or fastened to a gas outlet 758a or 758b in any suitable manner. In some embodiments, gas nozzles 846 may be received in frame insert 444 such that they are disposed substantially in substrate transfer area 332 and/or above a bottom surface of substrate transfer area 332. The gas nozzles 846 coupled to frame insert 444 may oriented and/or arranged to direct gas in various directions and/or dispersal and/or diffusion patterns into and/or around substrate transfer area 332. Although shown with one nozzle opening 847, some embodiments of gas nozzle 846 may have multiple nozzle openings. In some embodiments, such as shown in FIG. 8, e.g., gas nozzles 846 may be arranged with respect to a bottom surface 832 of substrate transfer area 332 at an angle θ, which may be about 32 degrees. In other embodiments, angle θ may have other suitable values. One or more gas nozzles 846 coupled to frame insert 444 may be in fluid communication gas passageway 757a or gas passageway 757b. In the alternative embodiments of FIG. 7D, one or more gas nozzles 846 coupled to frame insert 444 may be in fluid communication gas passageway 757.

Upon assembly of subassembly 400 (including lid 440, at least one gas conduit member 442, frame insert 444, and one or more gas nozzles 846), the one or more gas nozzles 846 may be configured to direct a flow of gas received at gas inlet 552 of lid 440 into substrate transfer area 332 of chamber port assembly 216. The gas may be a purge gas, such as, e.g., nitrogen, for reducing oxidation and/or corrosion of chamber port assembly parts and sealing interfaces, reducing particulate matter build-up in substrate transfer area 332, and/or reducing migration of particulate matter from chamber hardware onto a substrate being transferred through substrate transfer area 332 of chamber port assembly 216.

In some embodiments, chamber port assembly 216 may be used with, e.g., any etch process chamber included in a Centura AP or Centris electronic device manufacturing system available from Applied Materials, Inc., of Santa Clara, Calif.

Figure 9:
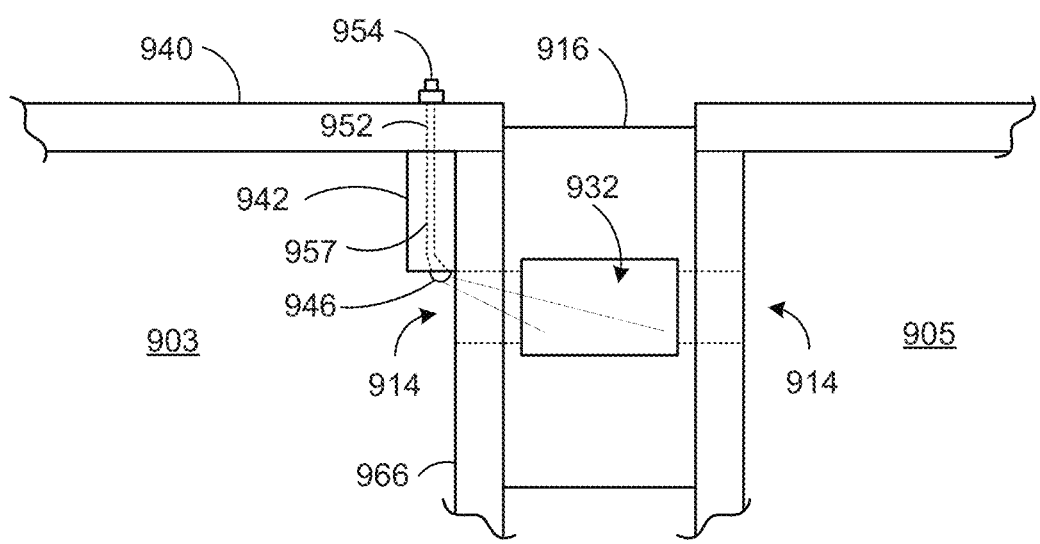
FIG. 9 illustrates a schematic cut-away view of a chamber port assembly disposed between two chambers according to embodiments.

FIG. 9 shows a first chamber 903 coupled to a second chamber 905 via a chamber port assembly 916, which may be of conventional design and/or construction. Chamber port assembly 916 may have a substrate transfer area 932 configured to receive a substrate there through as the substrate is transferred through chamber port assembly 916 from one of first and second chambers 903 or 905 to the other of first and second chambers 903 or 905. First and second chambers 903 and 905 may each be a transfer chamber, such as, e.g., transfer chamber 102, or a process chamber, such as, e.g., a process chamber 104 or 204. First and second chambers 903 and 905 may each have a chamber port 914 configured to interface with a respective chamber side of chamber port assembly 916. Each chamber port 914 may be, e.g., an elongated opening in a side wall of the chamber. Either or both of first and second chambers 903 and 905 may be configured to direct a flow of gas into substrate transfer area 932, as now described in connection with first chamber 903.

In some embodiments, first chamber 903 may include a gas inlet 952 formed in a lid 940 of first chamber 903. In other embodiments, gas inlet 952 may be formed in a side wall of first chamber 903. Gas inlet 952 may be configured to be coupled to a gas inlet connector 954, which in turn may be configured to be coupled to a gas line and gas delivery apparatus, such as, e.g., gas line 355 and gas delivery apparatus 356 (FIG. 3). First chamber 903 may also include a gas conduit member 942, which may be mounted to lid 940 and/or side wall 966 of first chamber 903. Gas conduit member 942 may have a gas passageway 957 extending internally there through and in fluid communication with gas inlet 952. Gas conduit member 942 may also have one or more gas nozzles 946 in fluid communication with gas passageway 957. Gas conduit member 942 and/or the one or more gas nozzles 946 may be disposed proximate to a chamber port 914 of first chamber 903, as shown. The one or more gas nozzles 946 may be configured to direct a flow of gas received at gas inlet 952 through chamber port 914 of first chamber 903 into and/or around substrate transfer area 932 of chamber port assembly 916.

In some embodiments, second chamber 905 may additionally or alternatively be configured similarly or identically as first chamber 903 to provide purge gas capability into and/or around substrate transfer area 932 through chamber port 914 of second chamber 905.

In some embodiments, chamber port assembly 216 may be integrated into a side wall of a transfer chamber. That is, chamber port assembly 216 may not be a separate entity positioned between two chambers, but may be part of a transfer chamber side wall configured to couple directly to another chamber, such as a process or load lock chamber. In some embodiments, chamber port assembly 216 may be an insertable component that fits into an appropriately configured chamber port of the transfer chamber. In some embodiments, a transfer chamber having an integrated chamber port assembly 216 may have a transfer chamber lid that has a gas inlet configured to align with, and be in fluid communication with, gas inlet 552 of lid 440. In other embodiments, chamber port assembly 216 may not have lid 440, wherein the transfer chamber lid may be configured to also serve as the lid of chamber port assembly 216. In some embodiments, the transfer chamber lid may have a removable access port configured above chamber port assembly 216. In some embodiments, frame insert 444 may be removable and replaceable without having to remove chamber port assembly 216 from the side wall of the transfer chamber.

Figure 10:
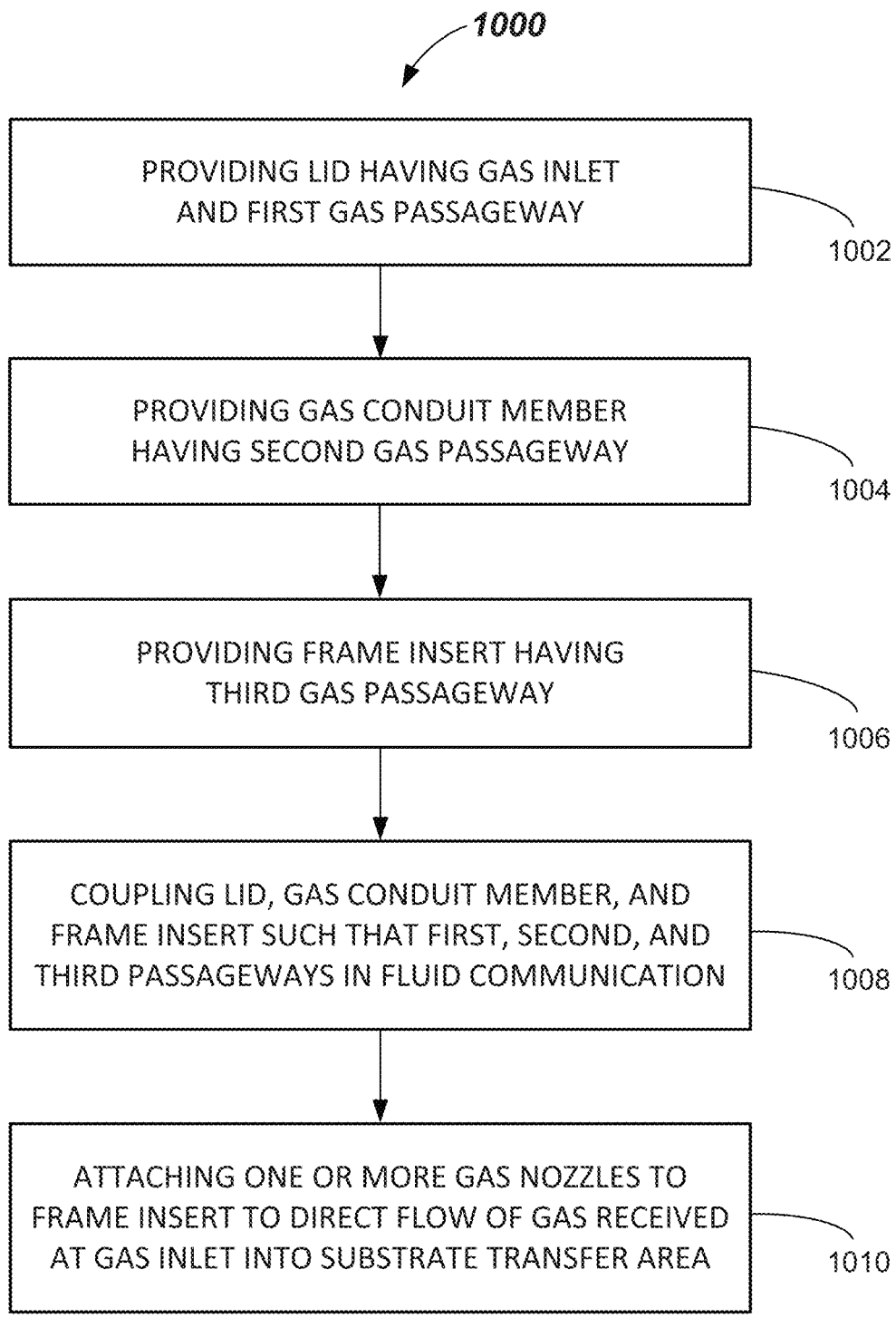
FIG. 10 illustrates a flowchart of a method of assembling a chamber port assembly for an electronic device manufacturing system according to embodiments.

FIG. 10 illustrates a method 1000 of assembling a chamber port assembly for an electronic device manufacturing system in accordance with one or more embodiments. At process block 1002, method 1000 may include providing a lid having a gas inlet formed therein and a first gas passageway extending there through, wherein the first gas passageway is in fluid communication with the gas inlet. In some embodiments, the lid may be, e.g., lid 440 having a gas inlet 552 and a gas passageway 557 in fluid communication with gas inlet 552, as shown in FIGS. 5A and 5B.

At process block 1004, a gas conduit member having a second gas passageway extending there through may be provided. For example, in some embodiments, the gas conduit member may be gas conduit member 442, which may include a gas passageway 657 extending there through, as shown in FIG. 6B. In some embodiments, a second gas conduit member 442 may additionally be provided.

At process block 1006, method 1000 may include providing a frame insert having a third gas passageway extending there through, wherein the frame insert is configured to receive one or more gas nozzles such that the third gas passageway is in fluid communication with the one or more gas nozzles. For example, in some embodiments, the frame insert may be frame insert 444, the one or more gas nozzles may be gas nozzles 846, and the third gas passageway may be any one of gas passageways 757a or 757b of FIG. 7C or gas passageway 757 of FIG. 7D.

At process block 1008, method 1000 may include coupling the lid, gas conduit member, and frame insert such that the first, second, and third gas passageways are in fluid communication with each other. For example, in some embodiments, the lid may be lid 440, the gas conduit member may be gas conduit member 442, and the frame insert may be frame insert 444, all of which may be coupled together as shown and described above in connection with FIGS. 4A-E. As a result of the coupling, gas passageway 557, gas passageway 657, and at least one of gas passageways 757a, 757b, or 757 may be in fluid communication with each other.

At process block 1010, method 1000 may include attaching the one or more gas nozzles to the frame insert such that the one or more gas nozzles are configured to direct a flow of gas received at the gas inlet into a substrate transfer area of the chamber port assembly. The one or more gas nozzles may be, e.g., gas nozzles 846, which may be Vespel® nozzles. The one or more gas nozzles 846 may be mounted to gas outlets 758a and 758b of frame insert 444 such that a flow of gas received at gas inlet 552 is directed into substrate transfer area 332 of chamber port assembly 216. In some embodiments, e.g., gas nozzles 846 may be angled at about 32 degrees with respect to a surface of substrate transfer area 332, as shown in FIG. 8.

The above process blocks of method 1000 may be executed or performed in an order or sequence not limited to the order and sequence shown and described. For example, in some embodiments, any of process blocks 1002, 1004, and 1006 may be performed before, after, or simultaneously with any other of process blocks 1002, 1004, and/or 1006.

Persons skilled in the art should readily appreciate that the embodiments of the invention described herein is susceptible of broad utility and application. Many embodiments and adaptations of the invention other than those described herein, as well as many variations, modifications, and equivalent arrangements, will be apparent from, or reasonably suggested by, the invention and the foregoing description thereof, without departing from the substance or scope of the invention. For example, although described herein as being used primarily between a transfer chamber and a process chamber of an electronic device manufacturing system, chamber port assemblies in accordance with one or more embodiments of the invention may be used between any two chambers and/or structures where contamination of a transferred workpiece by particulate matter is a concern. Accordingly, while the invention has been described herein in detail in relation to specific embodiments, it should be understood that this disclosure is only illustrative and presents examples of the invention and is made merely for purposes of providing a full and enabling disclosure of the invention. This disclosure is not intended to limit the invention to the particular apparatus, devices, assemblies, systems, or methods disclosed, but, to the contrary, the intention is to cover all modifications, equivalents, and alternatives falling within the scope of the invention.

The invention claimed is:

1. A chamber port assembly of an electronic device manufacturing system, comprising:
   a lid having a gas inlet formed therein and a first gas passageway extending there through, the first gas passageway in fluid communication with the gas inlet;
   a gas conduit member having a second gas passageway extending there through, the second gas passageway in fluid communication with the first gas passageway;
   a frame insert having a third gas passageway in fluid communication with the second gas passageway; and
   one or more gas nozzles coupled to the frame insert and in fluid communication with the third gas passageway, the one or more gas nozzles configured to direct a flow of gas received at the gas inlet into a substrate transfer area, the substrate transfer area configured to receive a substrate as the substrate is transferred through the chamber port assembly from a first chamber to a second chamber.

2. The chamber port assembly of claim 1, further comprising a second gas conduit member having a fourth gas passageway extending there through, the fourth gas passageway in fluid communication with the first and third gas passageways.

3. The chamber port assembly of claim 1, further comprising a second gas conduit member having a fourth gas passageway extending there through, the fourth gas passageway in fluid communication with the first gas passageway, wherein the frame insert has a fifth gas passageway in communication with the fourth gas passageway and some of the one or more gas nozzles.

4. The chamber port assembly of claim 1, further comprising a slit valve mechanism that includes a door, the door having a closed position that abuts the frame insert and seals an opening to the substrate transfer area.

5. The chamber port assembly of claim 1, wherein the lid is butted against the gas conduit member.

6. The chamber port assembly of claim 1, wherein the gas conduit member is attached to the frame insert with bolts or screws.

7. The chamber port assembly of claim 1, wherein the gas conduit member is disposed between the lid and the frame insert.

* * * * *